Figure 1:
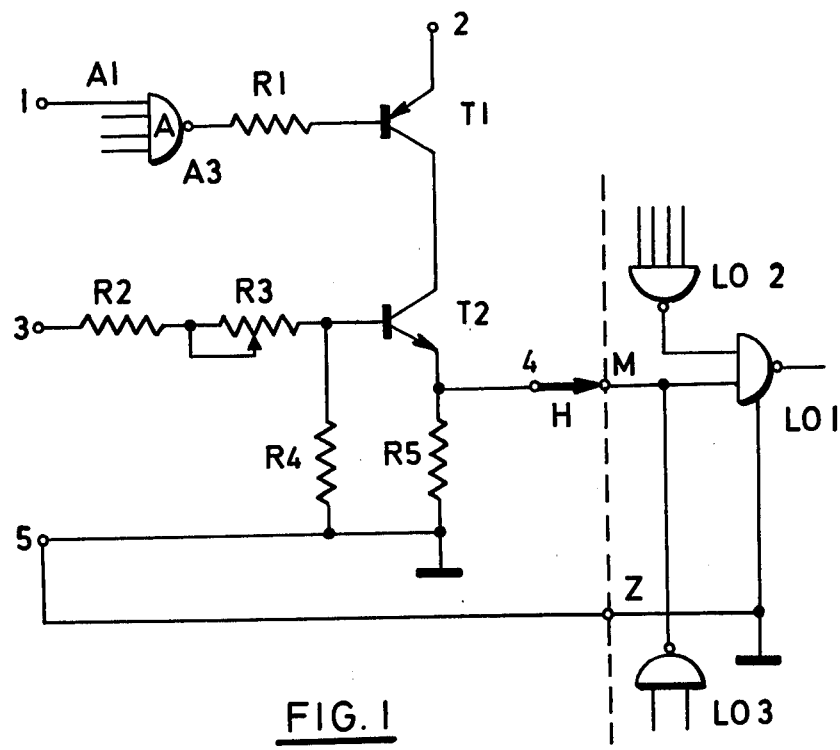

United States Patent [19]

Kupec et al.

[11] 4,041,384
[45] Aug. 9, 1977

[54] CIRCUIT SYSTEM FOR ADJUSTING THE INPUT OF A CONNECTED-UP LOGIC CIRCUIT

[75] Inventors: Jiří Kupec; Řehoř Hrdlička, both of Prague, Czechoslovakia

[73] Assignee: Tesla, narodni podnik, Prague, Czechoslovakia

[21] Appl. No.: 580,711

[22] Filed: May 27, 1975

[30] Foreign Application Priority Data

Nov. 5, 1973 Czechoslovakia .................. 7591/73

[51] Int. Cl.² ........................................... G01R 15/12
[52] U.S. Cl. ...................... 324/73 PC; 235/153 AC; 324/73 AT; 307/215
[58] Field of Search ...................... 324/73 PC, 73 AT; 307/215; 235/153 AC

[56] References Cited
U.S. PATENT DOCUMENTS

| 3,657,527 | 4/1972 | Kassabgi et al. .................. 235/153 |
| 3,673,397 | 6/1972 | Schaefer ............................. 235/153 |

Primary Examiner—Rudolph V. Rolinec
Assistant Examiner—Vincent J. Sunderdick

[57] ABSTRACT

A test circuit for stimulating the inputs of preprogrammed logic circuits, having a pulse input terminal connected to one of the inputs of a NAND circuit. The output of the NAND circuit is connected via a first resistor to the base of a first switching PNP transistor, the emitter of which is connected to a first positive voltage supply terminal and the collector of which is connected to the collector of a second switching NPN transistor. The base of the second NPN transistor is connected both through a fourth resistor to an earth terminal of the circuit system and through a third resistor and a second resistor to a second positive voltage supply terminal and the emitter of which is connected both through a fifth resistor to the earth terminal of the circuit system and to an output terminal. The output terminal is connected to a measuring point or probe which is connected to the input of the connected-up logic circuit. The connected-up logic circuit is connected to the earth terminal of the test circuit system.

1 Claim, 2 Drawing Figures

CIRCUIT SYSTEM FOR ADJUSTING THE INPUT OF A CONNECTED-UP LOGIC CIRCUIT

BACKGROUND OF THE INVENTION

The present invention relates to a circuit system which permits testing of integrated logic circuits on printed circuit boards without any particular knowledge of the respective integrated logic circuit to be tested. Thus faulty integrated logic circuits can be ascertained without complicated analyses, simply by applying a test signal (pulse) to a terminal of the integrated logic circuit to be tested and in particular to a test circuit system for stimulating to the logical one the input of a connected-up logic circuit level in which the inputs and/or one output of other logic circuits are connected to this input.

When stimulating the input of a logic circuit to logical levels difficulties result from the fact that the output of a logic circuit and the inputs of other logic circuits, the number of which is limited by the catalogue specification, are most likely connected to this input.

The current pulse, required to produce a change in the logical level on the input loaded by other inputs and also by one output, is relatively high while its maximum value is limited by the internal connection of the logic circuit. In addition, it has to be limited by the maximum value and the time, during which this pulse is exerting its influence on the input of the logic circuit, has to be duly defined.

The only method to solve this problem, which has been known in the art up to the present, is to generate current pulses by discharging a charged capacitor whose charge is produced during the period of time between two current pulses which are applied to the input to be tested.

These current pulses are always generated in pairs (in which one pulse is positive and the other negative) after depressing a pushbutton so that thus, for a short time, the input which has been at a logical zero can be stimulated to a logical one and the input which has been at a logical one can be stimulated to a logical zero. In this circuit system there remains, however, the fact that in order to obtain the required current pulse the capacitor charge has to be utilized and the time constant, resulting from the capacitor discharge value and other circuits, determines the time between the individual generated pulses which duly results in the use of a manually operated pushbutton.

The complexity of such a circuit system leads to the need of designing and producing a special integrated circuit so that it would be possible to construct a small-sized box in a shape of a testing point or probe. It is the object of this invention to do so.

The deficiencies mentioned above can be remedied according to the invention by a test circuit system for stimulating the input of a connected-up logic circuit to the logical one level in which the inputs and/or one output of other logic circuits are connected to this input comprising a control input terminal connected at least to the first input of a NAND logic circuit, the output of which is connected through a first resistor to the base of a first switching PNP transistor, the emitter of which is connected to a first supply terminal and the collector of which is connected to the collector of a second switching NPN transistor whose base is connected both through a fourth resistor to an earth terminal of the circuit system and through a third resistor and a second resistor to a second supply terminal and the emitter of the second switching transistor is connected both through a fifth resistor to the earth terminal of the circuit system and to an output terminal which is connected to a measuring point.

The stimulation of the input of the connected-up logic circuit to the logical one or zero level is accomplished by connecting the measuring point to the input of the connected-up logic circuit, and by connecting the earth terminal of the connected-up logic circuit to the earth terminal of the circuit system and the inputs of the connected-up logic circuit to the other connected-up logic circuits.

The advantage of the circuit system according to the present invention is that the pulse-repetition frequency of the stimulating pulses is limited only by the cut-off frequency of the test circuit system and the stimulating pulses can be generated in an uninterrupted sequence at an equal or uniform cycle. The circuit system according to the invention permits the input of the connected-up logic circuit to be brought to the logical zero by connecting the logic circuit to this input and, when the stimulating pulses are being generated, this input can be brought to the logical one by the circuit system.

Thus both logical levels are produced which are required to test a logic circuit without the use of a starting pushbutton. During this operation, when the input has been stimulated to the logical zero, the logic circuit whose output is connected up cannot be damaged. This simple circuit system, which is fitted with a relatively low number of components, enables the use of a testing probe suitable for manual testing to be constructed without being obliged to use a special integrated circuit designed according to the customer's specifications.

Figure 2:
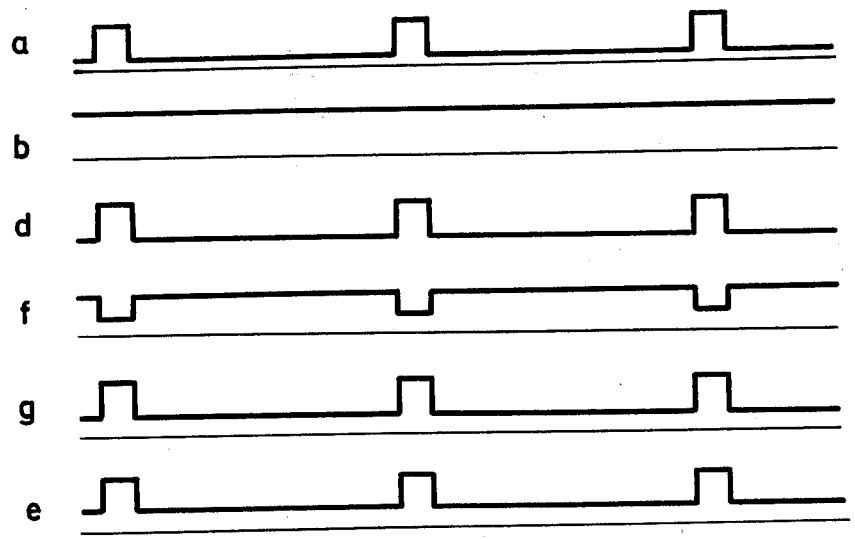

The invention will now be described in more detail, by way of example, with reference to the accompanying drawings, in which:

FIG. 1 is a schematic circuit diagram of the circuit system for adjusting the input of a connected-up logic circuit according to the present invention and FIG. 2 a,b,d,f,g,e, are pulse responses (wave forms) at different points of the circuit system according to the invention.

Referring to FIG. 1, a control input terminal 1 is connected to the input A1 of a NAND logic circuit A whose output A3 is connected through the first resistor R1 to the base of the first switching transistor T1 of PNP type. The emitter of the first switching transistor T1 is connected to the first supply terminal 2 while the collector of the same transistor T1 is connected to the collector of the second switching transistor T2 of NPN type. The base of the second switching transistor T2 is connected through the third resistor R3 and the second resistor R2, connected in series, to the second supply terminal 3 as well as through the fourth resistor R4 to the earth (ground) terminal 5 of the circuit system. The emitter of the second switching transistor T2 is connected through the fifth resistor R5 to the earth (ground) terminal 5 of the circuit system as well as to the output terminal 4 which is coupled to the measuring point H. In one embodiment of the invention shown in FIG. 1, the input M of the connected-up NAND logic circuit L01, which together with the other logic circuits L02 and L03 are to be stimulated to the logical one level, is connected to the measuring point H. The earth (ground) terminal Z of the connected-up NAND logic circuit L01 to be stimulated is connected to the earth (ground) terminal 5 of the circuit system.

Referring to FIG. 1 and 2 a,b,d,f,g,e, the operation of the test circuit system described above is as follows: Electric pulse a, shown in FIG. 2 a, applied to the control input terminal 1 are shaped in the NAND logic circuit A and then applied through the first resistor R1 to the base of the first switching transistor T1 or PNP type. The emitter of the first switching transistor T1 is fed by positive voltage, with respect to earth (ground) at a level of + 5 V, brought from the first supply terminal 2, and during the periods, when the first switching transistor T1 of PNP type is open due to the pulses a (FIG. 2), positive voltage is also applied to the collector of the second switching transistor T2 of NPN type. The base of the second switching NPN transistor T2 is fed from the voltage divider consisting of the second resistor R2, the third resistor R3, and the fourth resistor R4. This voltage divider is connected to the second supply terminal 3 on which a DC voltage of wave form b, see FIG. 2, can be measured. The emitter-base junction of the second switching transistor T2 is thus normally open and during the period when positive voltage is applied to the collector of the transistor T2, pulses d (see FIG. 2) are applied to the output terminal 4. Pulses of wave form f (FIG. 2) can be measured on the base of the first switching PNP transistor T1 as a result of the NAND logic circuit A while pulses of wave form g (FIG. 2) are measured on the collector of the same transistor T1 and pulses of wave form e (FIG. 2) can be measured on the base of the second switching NPN transistor T2.

The circuit system according to the present invention can be used for the construction of either simple or complex (multiple) point probes intended for testing logic circuits.

What is claimed is:

1. A test circuit system for stimulating the input of a connected-up logic circuit to the logical one level in which the inputs and/or one output of other logic circuits are connected to this input comprising a control pulse input terminal connected at least to the first input of a NAND logic circuit, the output of which is connected through a first resistor to the base of a first switching PNP transistor, the emitter of which is connected to a first positive voltage supply terminal and the collector of which is connected to the collector of a second switching NPN transistor the base of which is connected both through a fourth resistor to an earth terminal of the circuit system and through a third resistor and a second resistor to a second positive voltage supply terminal and the emitter of which is connected both through a fifth resistor to the earth terminal of the circuit system and to an output terminal, means for selectively connecting said output terminal to a measuring point, means for connecting said measuring point to the input of the connected-up logic circuit, and means for simultaneously connecting said connected-up logic circuit to the earth terminal of the test circuit system.

* * * * *